(12) United States Patent
Skotnicki et al.

(10) Patent No.: US 6,873,088 B2
(45) Date of Patent: Mar. 29, 2005

(54) VIBRATORY BEAM ELECTROMECHANICAL RESONATOR

(75) Inventors: Thomas Skotnicki, Crolles (FR); Didier Dutartre, Meylan (FR); Pascal Ribot, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 52 days.

(21) Appl. No.: 10/113,789

(22) Filed: Apr. 1, 2002

(65) Prior Publication Data

US 2002/0153808 A1 Oct. 24, 2002

(30) Foreign Application Priority Data

Apr. 3, 2001 (FR) ............................................. 01 04510

(51) Int. Cl.[7] .......................... H01L 21/00; H01L 29/82
(52) U.S. Cl. ...................................... 310/328; 310/363
(58) Field of Search ................................ 310/328, 363

(56) References Cited

U.S. PATENT DOCUMENTS

| | | | | | |
|---|---|---|---|---|---|
| 5,914,520 | A | * | 6/1999 | Werner | 257/415 |
| 6,046,524 | A | * | 4/2000 | Yamanouchi et al. | 310/313 R |
| 6,198,197 | B1 | * | 3/2001 | Yamanouchi et al. | 310/313 R |
| 6,249,073 | B1 | | 6/2001 | Nguyen et al. | 310/302 |
| 6,333,547 | B1 | * | 12/2001 | Tanaka et al. | 257/649 |
| 6,355,498 | B1 | * | 3/2002 | Chan et al. | 438/48 |
| 6,555,482 | B2 | * | 4/2003 | Skotnicki et al. | 438/738 |
| 2001/0030489 | A1 | | 10/2001 | Nguyen | 310/305 |
| 2001/0031025 | A1 | | 10/2001 | Nguyen | 375/34 |
| 2001/0033119 | A1 | | 10/2001 | Nguyen | 306/305 |
| 2001/0033121 | A1 | | 10/2001 | Nguyen | 300/316.6 |

FOREIGN PATENT DOCUMENTS

JP            2000101386 A    *   4/2000    ............ H03H/9/17

OTHER PUBLICATIONS

French Search Report from French Patent Application No. 01/04510, filed Apr. 3, 2001.

* cited by examiner

*Primary Examiner*—Thomas M. Dougherty
*Assistant Examiner*—J. Aguirrechea
(74) *Attorney, Agent, or Firm*—Lisa K. Jorgenson; James H. Morris; Wolf, Greenfield & Sacks, P.C.

(57) ABSTRACT

A resonator formed by the steps of defining an active single-crystal silicon layer delimited by a buried insulator layer, depositing a silicon-germanium layer by a selective epitaxy method so that the silicon-germanium layer grows above the active single-crystal silicon area, depositing by a non-selective epitaxy method a silicon layer and etching it according to a desired contour, and removing the silicon-germanium by a selective etching with respect to the silicon and to the insulator.

49 Claims, 1 Drawing Sheet

VIBRATORY BEAM ELECTROMECHANICAL RESONATOR

BACKGROUND OF THE INVENTION

1. Field of the Invention

The present invention relates to an electromechanical resonator particularly well adapted to applications in the radio-frequency field, for example, in the field of portable phones.

The present invention more specifically aims at a manufacturing method of such an electromechanical resonator which is compatible with the manufacturing of an integrated circuit, for example, a MOS-type integrated circuit.

2. Discussion of the Related Art

Many types of electromechanical resonators made with technologies similar to those of integrated circuits are known, which include a suspended beam connected to a first voltage, under which runs a conductive line at a second voltage, so that, when the electric frequency is close to the mechanical beam vibration frequency, a resonance occurs.

When such systems are desired to be formed, it is particularly important to accurately determine the resonance frequency. This frequency especially depends on the beam thickness, on its length and on the mechanical characteristics of the material forming the beam. The sensitivity especially depends on the distance between the beam and the excitation line.

SUMMARY OF THE INVENTION

The present invention aims at providing such a beam which is of simple manufacturing and compatible with integrated circuit technologies, and which has a well-determined resonance frequency, which is stable in time.

Another object of the present invention is to provide such a resonator which can be made in a particularly miniaturized form, to reach very high resonance frequencies that can exceed one GHz.

It should be noted that some of these features, and especially the features of stability and reproducibility of the mechanical constant, may exclude the use of polysilicon as the essential element forming the vibratory beam.

To achieve these and other objects, the present invention provides an electromechanical resonator formed on an active heavily-doped single-crystal silicon area of a substrate, forming a first electrode delimited by an insulating area, including a single-crystal silicon layer resting on the insulating layer by at least one of its ends and spaced apart from the active area.

The present invention provides a method for manufacturing a resonator, including the steps of:

defining an active single-crystal silicon area delimited by a buried insulator layer;

depositing a silicon-germanium layer by a selective epitaxy method so that the silicon-germanium layer grows above the active single-crystal silicon area and slightly beyond the periphery of this active area;

depositing by a non-selective epitaxy method a silicon layer and etching it according to a desired contour; and removing the silicon-germanium by a selective etching with respect to the silicon and to the insulator.

According to an embodiment of the present invention, the method further includes, after the silicon-germanium etching, an oxidation step.

According to an embodiment of the present invention, the method includes a contact-forming step.

According to an embodiment of the present invention, the selective chemical etching of the silicon-germanium is plasma-aided.

The foregoing objects, features and advantages of the present invention will be discussed in detail in the following non-limiting description of specific embodiments, in conjunction with the accompanying drawings.

DETAILED DESCRIPTION

Figure 1:
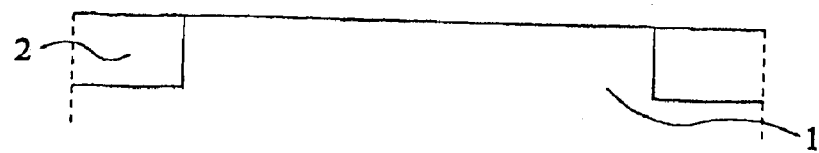
FIGS. 1 and 2 are simplified cross-section views illustrating the successive steps of a manufacturing method according to the present invention.

As shown in FIG. 1, a structure according to the present invention is formed from an active semiconductor area 1 delimited by an insulator area 2 filling a trench formed from the surface of region 1.

Active area 1 may be the upper portion of a semiconductor substrate or may correspond to a thin semiconductor layer formed on an insulating substrate (SOI). In all cases, region 1 will preferably be heavily doped and insulated from an underlying substrate by a dielectric insulation or by a junction insulation, as is well known in the art. Insulating areas 2 are, for example, made of silicon oxide.

Figure 2:
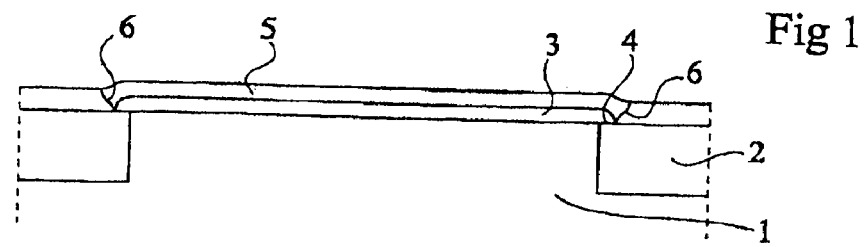

As illustrated in FIG. 2, a silicon-germanium layer 3 is grown by selective epitaxy above active area 1. Those skilled in the art know various methods to obtain such a selective epitaxy, which methods may be used in the invention. During the epitaxy, a slight lateral increase of the epitaxial layer may occur, above internal periphery 4 of insulating area 2. Then, a silicon layer 5 (non-selective epitaxy) is uniformly grown. This silicon layer will develop by epitaxy in single-crystal silicon form above silicon-germanium layer 3 and in polysilicon form above insulating layer 2. The limit between the single-crystal silicon and the polysilicon regions is schematically indicated by reference 6 in FIG. 2. It should however be noted that this limit is relatively fluctuating and depends on the manufacturing process.

Figure 3:
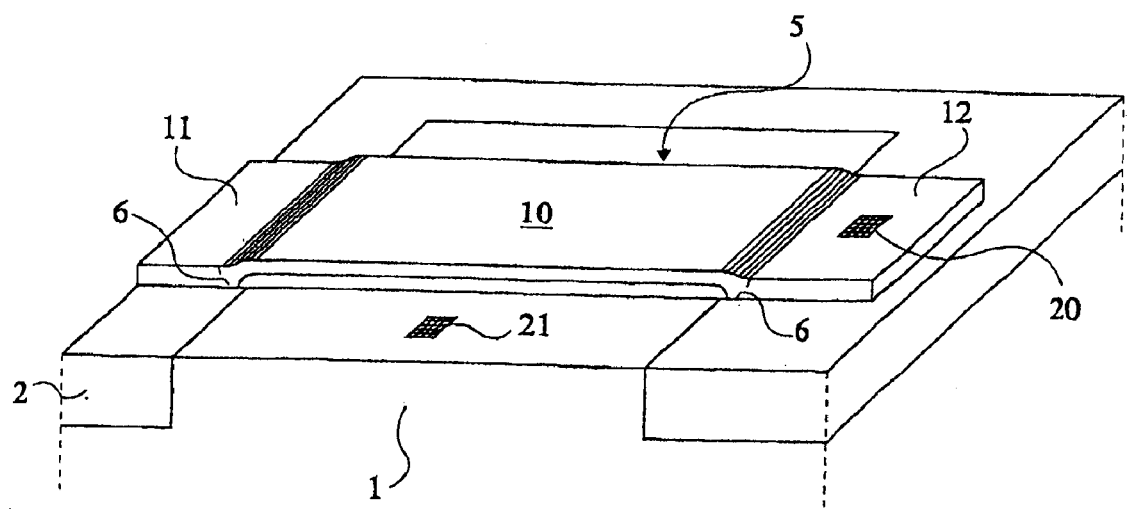
FIG. 3 is a simplified perspective view illustrating a subsequent manufacturing step of a resonator according to the present invention.

Subsequent steps of the method are illustrated in the simplified perspective view of FIG. 3. In a first step, silicon layer 5 is etched according to a chosen contour. After this, silicon-germanium layer 3 is selectively etched. This etching should be selective, especially with respect to silicon 3 and 1, and should also be selective with respect to silicon oxide 2. For this purpose, a plasma-aided chemical etching method, in which the plasma is used to create reactive chemical molecules very close to the structure surface, will, for example, be chosen. This method for example involves $NF_3$, $H_2$, and $N_2$, or $CF_4$, $H_2$, and $N_2$ molecules. A wet chemical etching may also be carried out in the presence of $HNO_3$ mixed with HF and $H_2O_2$ or $H_2O$.

Thus, a single-crystal silicon beam 10, embedded at its two ends 11 and 12 and separated in a very precise way from substrate 1 by a thickness corresponding to SiGe layer 3 which has been removed by etching, is obtained.

After the step of removal by etching of the SiGe layer, it should be noted that the apparent silicon naturally oxidizes and covers up with a very thin native oxide layer (thickness under 1 nm). A voluntary thermal oxidation may also be performed to obtain an oxide layer having a thickness from 1 to a few nm.

Contacts 20 and 21 may also be formed, respectively on one end 12 of beam 10 and on active area 1 of the substrate. Other means of contact with active area 1 may be provided.

The present invention is likely to have various alterations, modifications, and improvements which will readily occur to those skilled in the art. Thus, the manufacturing of a beam embedded at its two ends and operating as a vibratory rope has been previously described. A beam embedded at a single one of its ends may also be provided by performing a mask etching of thin single-crystal silicon layer 5 to remove embedding 11 on the left-hand side of FIGS. 2 and 3.

As an example of orders of magnitude, it may be provided to form a resonator such as that in FIG. 3, having a length on the order of from 0.1 to 10 $\mu$m, a width on the order of from 0.1 to a few $\mu$m, having a thickness on the order of from 5 to 100 nm, and having a distance from substrate 1 on the order of from 5 to 100 nm, all single-crystal silicon layers being coated with a thin oxide layer having a thickness from 1 to 5 nm.

The present invention has several advantages. Due to the fact that the embedded beam is made of single-crystal silicon, its physical characteristics are well known and thus, in particular, its modulus of elasticity is well defined and its characteristics are not likely to decline over time. Further, as is well shown by the above example, a particularly miniaturized device likely to operate at very high frequencies can be obtained with the present invention.

In the case where SiGe epitaxial layer 3 extends laterally above insulator 2, there is no risk of short-circuit between active silicon area 1 and silicon layer 5 formed by epitaxy. Otherwise, this risk can be eliminated by a slight isotropic etching of the silicon after etching of the silicon-germanium and/or by a thermal oxidation of the silicon.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An electromechanical resonator formed on an active heavily-doped single-crystal silicon area of a substrate, including a first electrode delimited by an insulating area, and a single-crystal silicon layer resting on the insulating area by at least one of its ends and spaced apart from the active area, wherein the electromechanical resonator is operative to electromechanically resonate at a predetermined frequency.

2. An electromechanical resonator comprising a silicon layer formed on a substrate and spaced apart from an active area of the substrate, said active area delimited by an insulating area, at least one edge of the electromechanical resonator contacting the insulating layer, wherein the electromechanical resonator is operative to electromechanically resonate at a predetermined frequency.

3. The resonator of claim 2, wherein the active area comprises the upper portion of a semiconductor substrate.

4. The resonator of claim 2, wherein the active area comprises a semiconductor layer formed on an insulating substrate.

5. The resonator of any of claim 3 or 4, wherein said active area is heavily doped.

6. The resonator of claim 2, wherein said insulating area comprises one of a dielectric insulation and a junction insulation.

7. The resonator of claim 6, wherein said insulating area comprises silicon oxide.

8. The resonator of claim 2, wherein the silicon layer comprises a single-crystal form above the intermediate layer, and comprises a polysilicon form above the insulating area.

9. The resonator of claim 8, wherein the single-crystal portion of the silicon layer is oxidized.

10. The resonator of claim 9, wherein the oxidization is thermally aided.

11. The resonator of claim 9, wherein the single-crystal portion of the silicon layer is between 0.1 $\mu$m and 10 $\mu$m long.

12. The resonator of claim 9, wherein the single-crystal portion of the silicon layer is between 0.1 $\mu$m and 3 $\mu$m long.

13. The resonator of claim 9, wherein the single-crystal portion of the silicon layer is between 5 nm and 100 nm thick.

14. The resonator of claim 9, wherein the single-crystal the single-crystal portion of the silicon layer and the active area is between 5 nm and 100 nm.

15. The resonator of claim 9, wherein the distance between the single-crystal portion of the silicon layer and the active area corresponds to the height of an intermediate layer removed from between the single-crystal portion of the silicon layer and the active area.

16. The resonator of claim 15, wherein the intermediate layer is comprised of silicon germanium.

17. The resonator of claim 2, further comprising at least one contact formed between the active layer and the silicon layer.

18. A method of using an integrated circuit as an electromechanical resonator, the integrated circuit comprising a silicon layer on a substrate and spaced apart from an active area of the substrate, the active area delimited by an insulating area, at least one edge of the silicon layer contacting the insulating layer, the method comprising:

(A) applying a time-varying potential difference between the silicon layer and the active area of the substrate at a first frequency, causing the silicon layer to vibrate.

19. The method of claim 18, wherein the integrated circuit comprises a single-crystal silicon layer.

20. The method of claim 18, wherein the integrated circuit comprises a silicon layer having a particular mechanical resonance frequency, and wherein (A) comprises applying the time-varying potential difference at a frequency at least close to the particular mechanical resonance frequency.

21. The method of claim 18, further comprising:

(B) manufacturing the electromechanical resonator, comprising:

providing the active area, delimitated by the insulating area;

growing an intermediate layer on the substrate above the active area and slightly beyond the periphery of the active area;

depositing the silicon layer on the intermediate layer; and removing the intermediate layer formed between the silicon layer and the insulating layer.

22. The method of claim 21, wherein the growing further comprises employing silicon germanium to form the intermediate layer.

23. The method of claim 21, wherein the depositing further comprises growing the silicon layer in single-crystal form above the intermediate layer, and in polysilicon form above the insulating area.

24. The method of claim 21, wherein the removing further comprises oxidizing the single-crystal portion of the silicon layer.

25. The method of claim 21, wherein (B) further comprises:
forming at least one contact between the active layer and the silicon layer.

26. A method of electromechanically resonating, comprising:
(A) using an integrated circuit comprising a silicon layer on a substrate and spaced apart from an active area of the substrate, the active area delimited by an insulating area, and at least one edge of the silicon layer contacting the insulating layer, by applying a time-varying potential difference between the silicon layer and the active area of the substrate at a first frequency, causing the silicon layer to vibrate.

27. The method of claim 26, wherein the integrated circuit comprises a single-crystal silicon layer.

28. The method of claim 26, wherein the integrated circuit comprises a silicon layer having a particular mechanical resonance frequency, and
wherein (A) comprises applying the time-varying potential difference at a frequency at least close to the particular mechanical resonance frequency.

29. The method of claim 26, further comprising:
(B) manufacturing the electromechanical resonator, comprising:
providing the active area, delimited by the insulating area;
growing an intermediate layer on the substrate above the active area and slightly beyond the periphery of the active area;
depositing the silicon layer on the intermediate layer; and
removing the intermediate layer formed between the silicon layer and the insulating layer.

30. The method of claim 29, wherein the depositing further comprises oxidizing the single-crystal portion of the silicon layer.

31. The method of claim 29, wherein (B) further comprises:
forming at least one contact between the active layer and the silicon layer.

32. The method of claim 29, wherein the growing further comprises employing silicon germanium to form the intermediate layer.

33. The method of claim 29, wherein the depositing further comprises growing the silicon layer in single-crystal form above the intermediate layer, and in polysilicon form above the insulating area.

34. A method of using a silicon layer to electromechanically resonate, the silicon layer disposed on a substrate and spaced apart from an active area of the substrate, the active area delimited by an insulating area, and at least one edge of the silicon layer contacting the insulating layer, the method comprising:
(A) applying a time-varying potential difference between the silicon layer and the active area of the substrate at a first frequency, causing the silicon layer to vibrate.

35. The method of claim 34, wherein the silicon layer is a single-crystal silicon layer.

36. The method of claim 34, wherein the silicon layer has a particular mechanical resonance frequency, and
wherein (A) comprises applying the time-varying potential difference at a frequency at least close to the particular mechanical resonance frequency.

37. The method of claim 34, further comprising:
(B) manufacturing the electromechanical resonator, comprising:
providing the active area, delimited by the insulating area;
growing an intermediate layer on the substrate above the active area and slightly beyond the periphery of the active area;
depositing the silicon layer on the intermediate layer; and
removing the intermediate layer formed between the silicon layer and the insulating layer.

38. The method of claim 37, wherein the growing further comprises employing silicon germanium to form the intermediate layer.

39. The method of claim 37, wherein the depositing further comprises growing the silicon layer in single-crystal form above the intermediate layer, and in polysilicon form above the insulating area.

40. The method of claim 37, wherein the removing further comprises oxidizing the single-crystal portion of the silicon layer.

41. The method of claim 37, wherein (B) further comprises:
forming at least one contact between the active layer and the silicon layer.

42. A method of electromechanically resonating, comprising:
(A) using a silicon layer disposed on a substrate and spaced apart from an active area of the substrate, the active area delimited by an insulating area, and at least one edge of the silicon layer contacting the insulating layer, by applying a time-varying potential difference between the silicon layer and the active area of the substrate at a first frequency, causing the silicon layer to vibrate.

43. The method of claim 42, wherein the silicon layer is a single-crystal silicon layer.

44. The method of claim 42, wherein the silicon layer has a particular mechanical resonance frequency, and
wherein (A) comprises applying the time-varying potential difference at a frequency at least close to the particular mechanical resonance frequency.

45. The method of claim 42, further comprising:
(B) manufacturing the electromechanical resonator, comprising:
providing the active area, delimited by the insulating area;
growing an intermediate layer on the substrate above the active area and slightly beyond the periphery of the active area;
depositing the silicon layer on the intermediate layer; and
removing the intermediate layer formed between the silicon layer and the insulating layer.

46. The method of claim 45, wherein the growing further comprises employing silicon germanium to form the intermediate layer.

47. The method of claim 45, wherein the growing further comprises growing the silicon layer in single-crystal form above the intermediate layer, and in polysilicon form above the insulating area.

48. The method of claim 45, wherein the removing further comprises oxidizing the single-crystal portion of the silicon layer.

49. The method of claim 45, wherein (B) further comprises:
forming at least one contact between the active layer and the silicon layer.

* * * * *

UNITED STATES PATENT AND TRADEMARK OFFICE
CERTIFICATE OF CORRECTION

PATENT NO. : 6,873,088 B2 Page 1 of 1
APPLICATION NO. : 10/113789
DATED : March 29, 2005
INVENTOR(S) : Thomas Skotnicki, Didier Dutartre and Pascal Ribot It is certified that error appears in the above-identified patent and that said Letters Patent is hereby corrected as shown below:

Claim 5, col. 3, line 63 should read:
--The resonator of any of claims 3 or 4, wherein said--

Claim 14, col. 4, line 18 should read:
--14. The resonator of claim 9, wherein the distance between--

Signed and Sealed this

Nineteenth Day of February, 2008

JON W. DUDAS
*Director of the United States Patent and Trademark Office*